US011293753B2

(12) United States Patent
Li et al.

(10) Patent No.: US 11,293,753 B2
(45) Date of Patent: Apr. 5, 2022

(54) AUTOMATIC LASER DISTANCE CALIBRATION KIT FOR WIRELESS CHARGING TEST SYSTEM (71) Applicant: SICHUAN ENERGY INTERNET RESEARCH INSTITUTE, TSINGHUA UNIVERSITY, Sichuan (CN)

(72) Inventors: Tun Li, Sichuan (CN); Siming Pan, Sichuan (CN); Dawei He, Sichuan (CN); Yi Liu, Sichuan (CN); Jingdong Sun, Sichuan (CN)

(73) Assignee: SICHUAN ENERGY INTERNET RESEARCH INSTITUTE, TSINGHUA UNIVERSITY, Sichuan (CN)

( * ) Notice: Subject to any disclaimer, the term of this patent is extended or adjusted under 35 U.S.C. 154(b) by 6 days.

(21) Appl. No.: 16/772,705

(22) PCT Filed: Apr. 19, 2018

(86) PCT No.: PCT/CN2018/083640
§ 371 (c)(1),
(2) Date: Jun. 12, 2020

(87) PCT Pub. No.: WO2019/114168
PCT Pub. Date: Jun. 20, 2019

(65) Prior Publication Data
US 2020/0326371 A1    Oct. 15, 2020

(30) Foreign Application Priority Data

Dec. 13, 2017    (CN) .......................... 201711324032.7

(51) Int. Cl.
*G01R 31/302*    (2006.01)
*G01C 3/08*    (2006.01)
(Continued)

(52) U.S. Cl.
CPC ........... *G01C 3/08* (2013.01); *G01R 29/0807* (2013.01); *G01R 31/3025* (2013.01);
(Continued)

(58) Field of Classification Search
CPC .. G01C 3/08; G01R 31/3025; G01R 29/0807; G01R 35/005; G01R 31/72; H02J 50/10; H02J 7/02; H02J 7/00; H02J 50/90
(Continued)

(56) References Cited

U.S. PATENT DOCUMENTS 8,310,653 B2 * 11/2012 Ogawa .................... G01S 7/497
356/4.07
2002/0021137 A1 * 2/2002 Takeuchi ............. G01R 35/005
324/750.02
(Continued)

FOREIGN PATENT DOCUMENTS

CN        1739194 A        2/2006
CN      105388483 A        3/2016
(Continued)

*Primary Examiner* — Tung X Nguyen
*Assistant Examiner* — Robert P Alejnikov, Jr.
(74) *Attorney, Agent, or Firm* — Novick, Kim & Lee, PLLC; Allen Xue (57) ABSTRACT The present invention discloses an automatic laser calibration kit for calibrating the distance between a test device of a wireless charging system and a device under test (DUT). The calibration kit may be located in a wireless charging test system. The test system may comprise a test plane for controlling the DUT and a gripping arm for controlling the test device. The calibration kit may comprise: a laser pointer, configured to emit a laser beam; a mirror, positioned on the gripping arm and configured to reflect the laser beam to form a spot on the test plane; and a camera, configured to monitor the position of the spot.

7 Claims, 6 Drawing Sheets (51) Int. Cl.
*H02J 50/10* (2016.01)
*G01R 29/08* (2006.01)
*G01R 35/00* (2006.01)
*H02J 7/02* (2016.01)

(52) U.S. Cl.
CPC .............. *G01R 35/005* (2013.01); *H02J 7/02* (2013.01); *H02J 50/10* (2016.02)

(58) Field of Classification Search
USPC ........................................................ 356/4.01
See application file for complete search history.

(56) References Cited

U.S. PATENT DOCUMENTS

| | | | | |
|---|---|---|---|---|
| 2005/0253613 | A1* | 11/2005 | Komatsu | G01R 31/2891 324/750.22 |
| 2006/0028641 | A1* | 2/2006 | Frank | G01N 21/9501 356/244 |
| 2006/0290920 | A1* | 12/2006 | Kampchen | G01S 17/86 356/139.04 |
| 2007/0046947 | A1* | 3/2007 | Lo | G01R 31/307 356/492 |
| 2013/0314688 | A1* | 11/2013 | Likholyot | G01S 17/48 356/3.1 |
| 2014/0306547 | A1* | 10/2014 | Yanagawa | H01F 38/14 307/104 |
| 2015/0015700 | A1* | 1/2015 | Becker | G01S 17/66 348/136 |
| 2015/0116691 | A1* | 4/2015 | Likholyot | G01C 15/002 356/4.01 |
| 2015/0204928 | A1* | 7/2015 | Hoover | H02J 50/40 320/108 |

FOREIGN PATENT DOCUMENTS

| | | | |
|---|---|---|---|
| CN | 106154081 | A | 11/2016 |
| CN | 205679197 | U | 11/2016 |
| CN | 106274537 | A | 1/2017 |
| CN | 106597084 | A * | 4/2017 |
| CN | 106597084 | A | 4/2017 |
| CN | 107179460 | A | 9/2017 |
| CN | 107340445 | A | 11/2017 |
| JP | 2014079029 | A | 5/2014 |

* cited by examiner

AUTOMATIC LASER DISTANCE CALIBRATION KIT FOR WIRELESS CHARGING TEST SYSTEM

FIELD OF THE INVENTION

The present invention relates to the field of wireless charging systems, and more particularly to a method for calibrating the distance between electromagnetic coils in a wireless charging test system and an automatic laser calibration kit.

DESCRIPTION OF THE RELATED ART

Wireless charging is an evolving technology that brings new convenience to charging electronic devices. In wireless charging systems, particularly inductive wireless charging systems, energy is transferred from one or more power transmitter (TX) coils to one or more power receiver (RX) coils by means of magnetic field coupling.

The magnetic coil may generate a magnetic field, and the magnetic field coupling between the TX and RX coils is affected by the relative position and distance between the coils, which may further affect the charging efficiency of the charging system. In order to improve the user experience and ensure the reliability of wireless charging, the wireless charging system should be fully tested. In order to evaluate the coupling between the TX and RX coils in a wireless charging system, the distance between the coils needs to be calibrated to ensure reliable and consistent results.

The present invention also provides an automatic laser calibration kit for a wireless charging test system. The kit may be easily integrated into a wireless charging test system or a similar measuring device. Such kit accurately and automatically calibrates the distance between the TX and RX coils.

SUMMARY OF THE INVENTION

One aspect of the present invention relates to an automatic laser calibration kit for calibrating the distance between a test device of a wireless charging system and a device under test (DUT). The calibration kit may be located in a wireless charging test system. The test system may comprise a test plane for gripping the DUT and a gripping arm for gripping the test device. The calibration kit may comprise: a laser pointer, configured to emit a laser beam; a mirror, positioned on the gripping arm and configured to reflect the laser beam to form a spot of light on the test plane; and a camera configured to monitor the position of the spot.

Another aspect of the present invention relates to a wireless charging test system for testing a wireless charging system. The test system may comprise a gripping arm, configured to grip a test device; a test plane, configured to grip a DUT; and an automatic laser calibration kit, for calibrating the distance between the test device and the DUT.

Another aspect of the present invention relates to a method for calibrating the distance between a test device of a wireless charging system and a DUT by using an automatic laser calibration kit mounted in a wireless charging test system. The test system may comprise a test plane for controlling the DUT and a gripping arm for controlling the test device. The calibration kit may comprise: a laser pointer, configured to emit a laser beam; a mirror, positioned on the gripping arm and configured to reflect the laser beam to form a spot of light on the test plane; and a camera, configured to monitor the position of the spot. The method may comprise: setting a reference position of a spot; setting an initial distance between the DUT and the test device; changing the distance between the DUT and the test device and monitoring the position of the spot; and stopping changing the distance between the DUT and the test device when the position of the spot overlaps the reference position.

Another aspect of the present invention relates to a method for calibrating the distance between a test device of a wireless charging system and a DUT by using an automatic laser calibration kit mounted in a wireless charging test system. The test system may comprise a test plane for gripping the DUT, a gripping arm for gripping the test device, and a laser pointer mounted on the gripping arm and configured to form a spot on the test plane. The method may comprise: setting a reference position of the spot on the test plane, and moving the gripping arm relative to the test plane until the spot coincides with the reference position on the test plane.

It should to be understood that both that general description and the following detail description are exemplary and explanatory only and are not restrictive of the present invention, as claimed.

BRIEF DESCRIPTION OF THE DRAWINGS

The drawings that form a part of the present invention illustrate several non-limiting embodiments and, together with the description, are configured to explain the disclosed principles.

DESCRIPTION OF THE PREFERRED EMBODIMENTS

Reference will now be made in detail to the exemplary embodiments. The description below refers to the accompanying drawings. Unless otherwise indicated, the same marks in different figure represent the same or similar elements. The embodiments set forth in the following description of exemplary embodiments according to the present invention are not intended to represent all implementations according to the present invention. Instead, they are merely examples of systems and methods consistent with aspects of the present invention.

The present invention proposes an automatic laser distance calibration kit. The structure and calibration method of the calibration kit are described. The calibration kit may measure the actual position of an RX coil by monitoring the position of a spot produced by a laser pointer, thus eliminating any significant errors introduced during the measurement. In addition, the calibration kit may be easily installed and integrated into a wireless charging test system, a near field scanning instrument or other similar test equipment.

Figure 1:
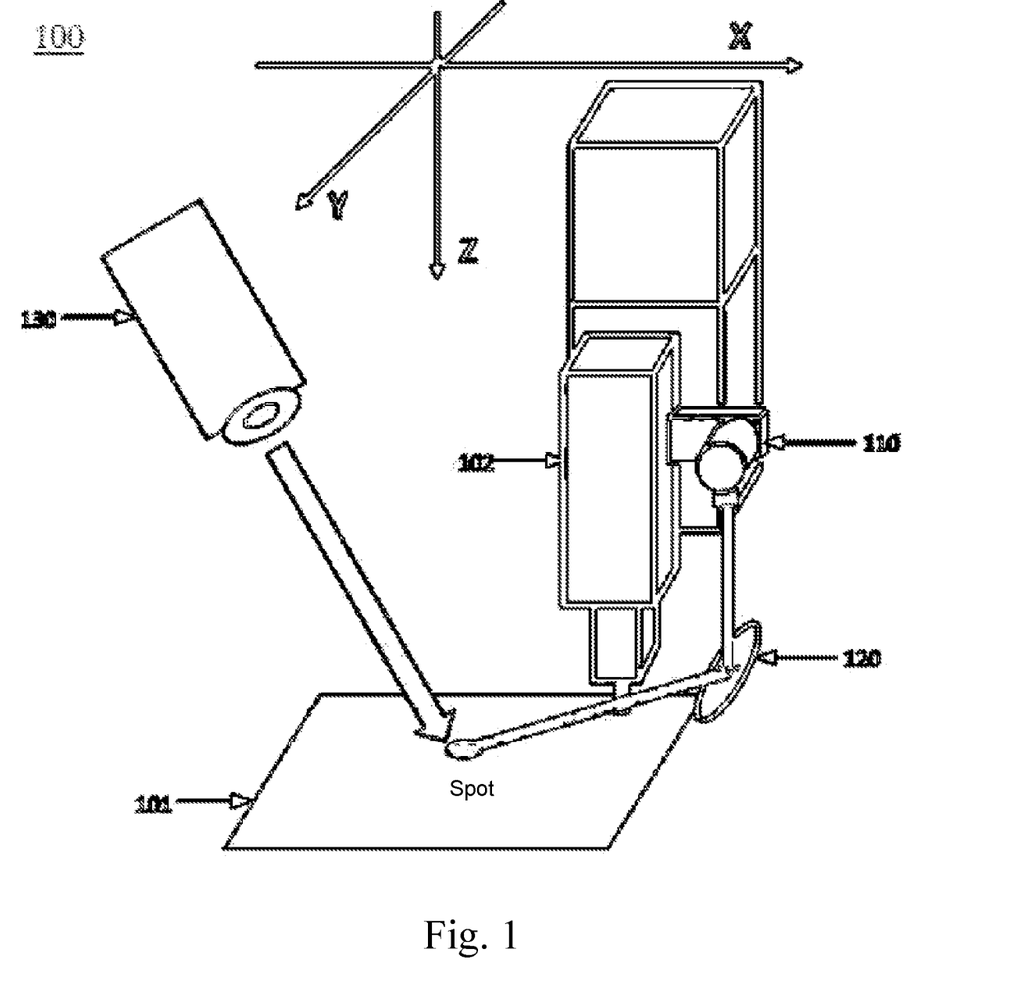
FIG. 1 is a schematic diagram of a wireless charging test system mounted with an automatic laser distance calibration kit according to an exemplary embodiment of the present invention.

FIG. 1 shows a wireless charging test system 100 mounted with an automatic laser distance calibration kit according to an exemplary embodiment of the present invention. The system 100 and the calibration kit may comprise multiple components, some of which may be optional. In some embodiments, the system 100 and the calibration kit may comprise more components than those shown in FIG. 1. However, in order to disclose illustrative embodiments, it is not necessary to show all of these components.

As shown in FIG. 1, the automatic laser distance calibration kit may comprise a laser pointer 110, a mirror 120 and a camera 130. The kit may be installed in the wireless charging test system 100. The system 100 may comprise a test plane 101 and a gripping arm 102. In some embodiments, the laser pointer 110 and the mirror 120 may be mounted on the gripping arm 102.

In some embodiments, the test plane 101 may be a horizontally placed plane having a surface that is parallel to the ground and parallel to the x-y plane. A device under test (DUT) may be fixed to the test plane 101 for measurement. In some embodiments, the DUT may be a TX coil or a TX-related electronic product. The gripping arm 102 is movable in the z direction. The arm may be configured to grip and move measurement probes, fixtures, wireless charging-receiving electronics, automatic laser distance calibration kits, or the like. The test device may be fixed to the fixture and may be moved along the z-direction together with the mirror 120 by the gripping arm 102. In some embodiments, the test device may be an RX coil, a measurement probe or an RX-related electronic product. The distance between the DUT on test plane 101 and the test device (e.g., TX and RX coils) on the gripping arm 102 in the z-direction may be controlled by the gripping arm 102. In some descriptions, a TX coil is used as an exemplary DUT, and an RX coil is used as an exemplary test device.

The position of the test device and the device under test may be interchangeable. In one embodiment, the test device may be fixed to the gripping arm 102 and the device under test may be fixed to the test plane 101. In another embodiment, the test device may be fixed to the test plane 101 and the device under test may be fixed to the gripping arm 102.

In some embodiments, the test plane 101 may also be moved in the z-direction, and the distance between the DUT and the test device (e.g., TX and RX coils) changes accordingly when the position of the test plane 101 is adjusted.

The laser pointer 110 in the automatic laser distance calibration kit may emit a narrow laser beam in the z direction, then the beam is reflected by the mirror 120 and form a spot on the test plane 101. The mirror 120 may be fixed to the gripping arm 102 at an angle and configured to reflect the laser beam emitted by the laser pointer 110. The angle of the mirror 120 relative to the test plane 101 may be designed according to the requirements of a user. For example, the angle may be 30°, 45° or 60° depending on the specific requirements. The camera 130 is configured to monitor the position of the spot on the test plane 101 by means of an image processing technique. The camera 130 also transmits position information of the spot to a control computer which may control the distance between the TX and RX coils by changing the position of the gripping arm (or test plane). The control computer may comprise a linear actuator that adjusts the position of the gripping arm (or test plane). The control computer controls the linear actuator to move the gripping arm (or test plane) at different speed. For example, when the distance between the TX and RX coils is significantly different from a target distance, the control computer quickly moves the gripping arm, and slows the movement of the gripping arm as the distance approaches the target distance. The control computer may comprise a non-transitory computer readable medium that stores program codes for controlling a calibration process, and measuring and analyzing the distance between the TX and RX coils.

Figure 2:
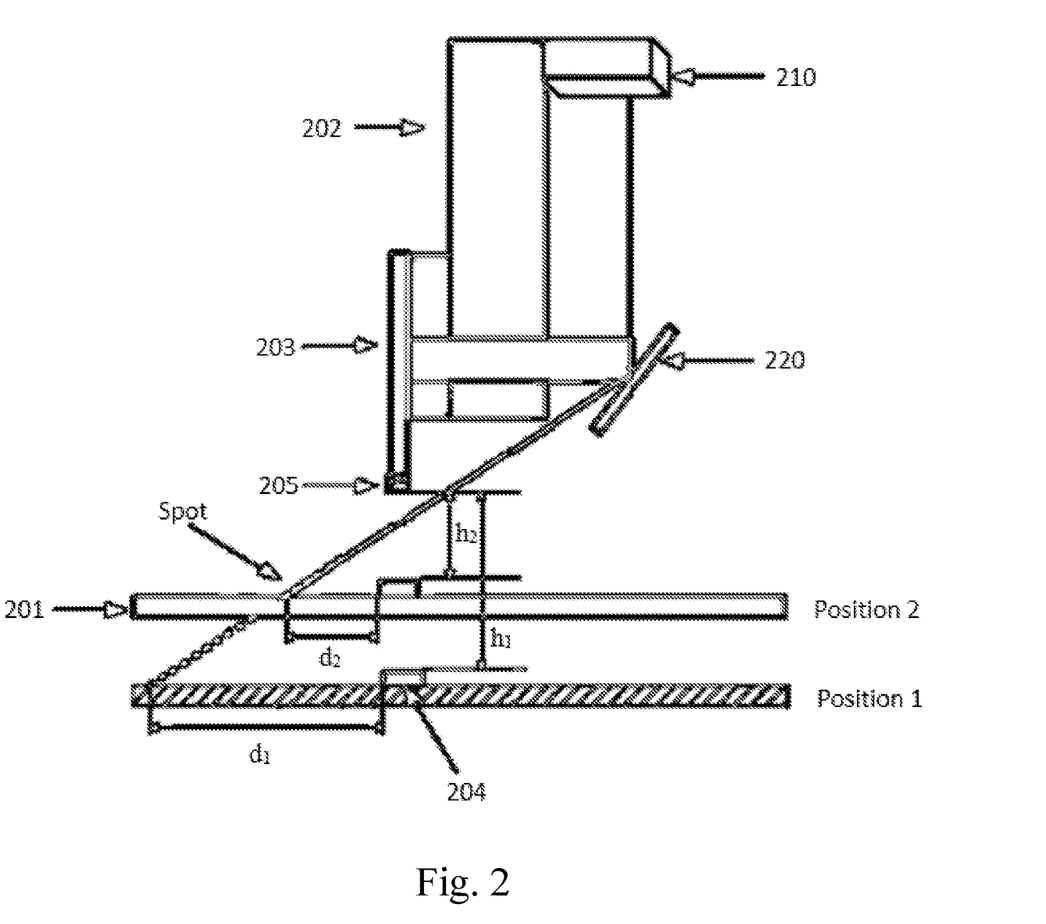
FIG. 2 is a schematic diagram of the operational mechanism of an automatic laser range calibration kit according to an exemplary embodiment of the present invention.

FIG. 2 is a diagram showing the operational mechanism of an automatic laser range calibration kit according to an exemplary embodiment of the present invention.

As shown in FIG. 2, a wireless charging test system may comprise a test plane 201, a gripping arm 202 and a fixture 203 that is fixed to the gripping arm 202. A DUT 204 is placed on the test plane 201. In some embodiments, the DUT 204 may be a wireless charging pad and may comprise one or more TX coils. A test device 205 (e.g., an RX coil) may be fixed to the fixture 203. An automatic laser distance calibration kit is mounted on the gripping arm 202. The calibration kit is moved with the test device 205 by the gripping arm 202. The calibration kit may comprise a laser pointer 210 and a mirror 220. In some embodiments, the laser pointer 210 and the mirror 220 may be mounted on the gripping arm 202. The laser pointer 210 produces a laser beam in the z direction. The laser beam is reflected by the mirror 220 and forms a spot on the test plane 201. The mirror 220 may be placed at an angle relative to the test plane 201. The change in the position of the spot on the test plane 201 is proportional to the change in the distance between the DUT and the test device. The calibration kit may also comprise a camera (not shown in FIG. 2) for capturing the position of the spot on the test plane 201.

In some embodiments, the distance between the DUT 204 and the test device 205 in the z-direction may be varied by moving the position of the gripping arm 202. In some embodiments, such distance may be varied by moving the position of the test plane 201. To better illustrate the working mechanism, the position of the DUT 204 is selected in FIG. 2 as a reference. The position of the spot may be determined by means of the angle of the mirror 220 and the distance between the DUT 204 and the test device 205. At position 1, the distance between the DUT 204 and the test device 205 in the z-direction is denoted as $h_1$, and the distance between the spot on the test plane and the DUT 204 is denoted as $d_1$. At position 2, the distance between the DUT 204 and the test device 205 in the z-direction is denoted as $h_2$, and the distance between the spot on the test plane and the DUT 204 is denoted as $d_2$. The change in distance is proportional, that is $\Delta h \propto \Delta d$, where $\Delta h = |h_1 - h_2|$, $\Delta d = |d_1 - d_2|$. In other words, the change $\Delta d$ in the position of the spot may be measured, and the change in the distance between the DUT 204 and the test device 205 in the z direction may be determined accordingly. As the position of the spot is monitored and reported to the control computer, the distance between the DUT 204 and the test device 205 in the z-direction may be determined and calibrated.

The laser beam may not be limited to forming a spot on the test plane of the wireless charging test system. In some embodiments, the laser beam reflected by the mirror may form a spot on any flat surface as long as the change in the position of the spot on the surface is proportional to the change in the distance between the DUT and the test device in the z-direction.

Figure 3A:
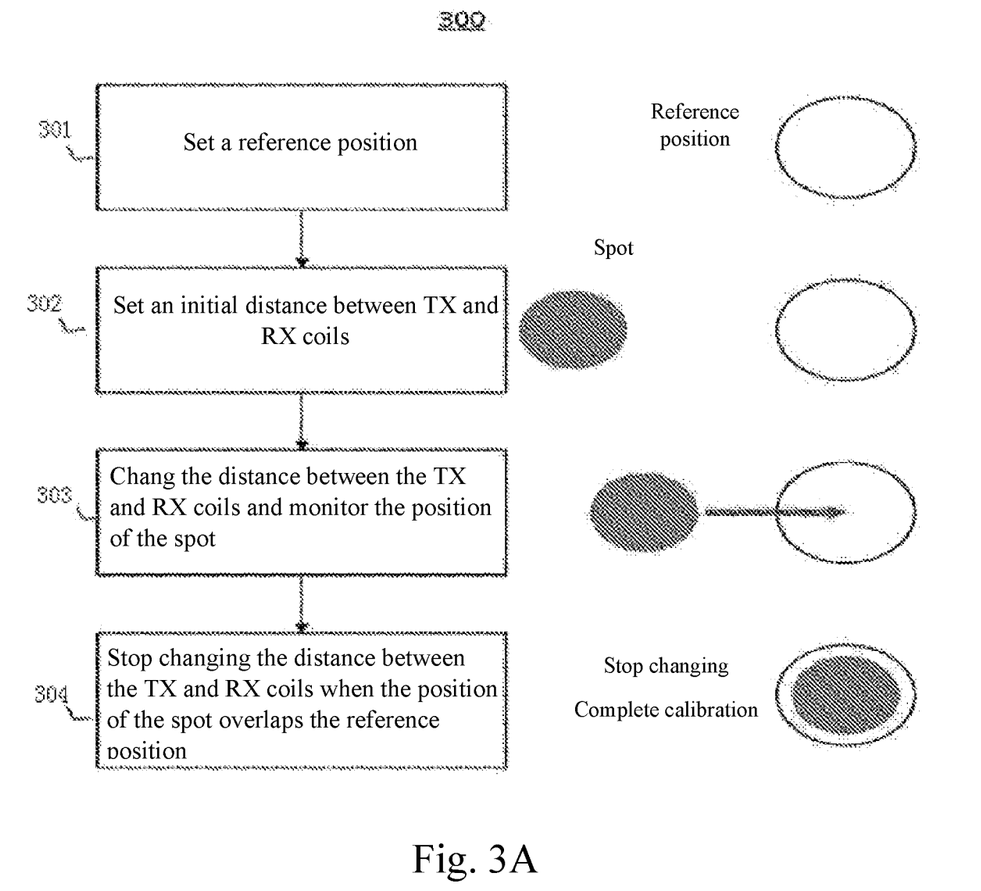
FIG. 3A is a flow chart of a method for calibrating the distance between a device under test and a test device by means of an automatic laser distance calibration kit.

FIG. 3A is a flowchart of a method 300 for calibrating the distance between a DUT and a test device by means of an automatic laser distance calibration kit according to an exemplary embodiment of the present invention. In some embodiments, the DUT may be a TX coil and the test device may be an RX coil. As previously mentioned, the TX coil may be mounted on a test plane of a wireless charging test system, and the RX coil may be fixed to a fixture on a gripping arm of the test system. The system is equipped with an automatic laser distance calibration kit to calibrate the distance between the TX and RX coils.

In step 301, a reference position is set on the test plane, which is indicated by an open circle in FIG. 3A. A reference position may be regarded as a target position of a spot generated by a laser beam. Since the position of the spot is associated with the distance between the TX and RX coils, the reference position may set the distance between the TX and RX coils as a known value. In other words, once the spot overlaps the reference position, the distance between the TX and RX coils is a known value preset by a user. Therefore, the distance may be calibrated.

In step 302, the initial distance between the TX and RX coils is set by lifting the gripping arm (or lowering the test plane). A laser pointer emits a laser beam that is reflected by a mirror and forms a spot on the test plane. The initial distance may be any distance allowed by the test system. For example, the user may observe the spot and the reference position with eyes to set the initial distance at which the spot is as close as possible. Alternatively, the initial distance may be the distance the test plane and the gripping arm remain at the last measured position. In this case, step 302 may be omitted. The position of the spot shown by the solid circle in FIG. 3A may be initially away from the reference position, at which point the distance between the TX and the RX coils is different from a predetermined value.

In step 303, the distance between the TX and RX coils is gradually reduced by lowering the gripping arm toward the test plane (or moving the test plane toward the gripping arm, or both). Therefore, the position of the spot gradually approaches the reference position, and the distance between the TX and RX coils gradually approaches the predetermined value. The position of the spot is monitored by the camera and reported to the control computer. In another case, the initial positions of the TX and RX coils may be too close, and the distance is gradually increased by lifting the gripping arms and/or lowering the test plane until the spot coincides with the reference position.

In step 304, when the spot reaches the reference position, that is, the spot completely overlaps the reference position, the changing the position of the gripping arm (or test plane) is stopped. Once the spot overlaps the reference position, the distance between the TX and RX coils may be considered to be the same as the predetermined value, and the distance is calibrated. As noted above, the test system may comprise one or more linear actuators, and the movement of the gripping arms and/or the test plane may be actuated and controlled by the linear actuator.

Figure 3B:
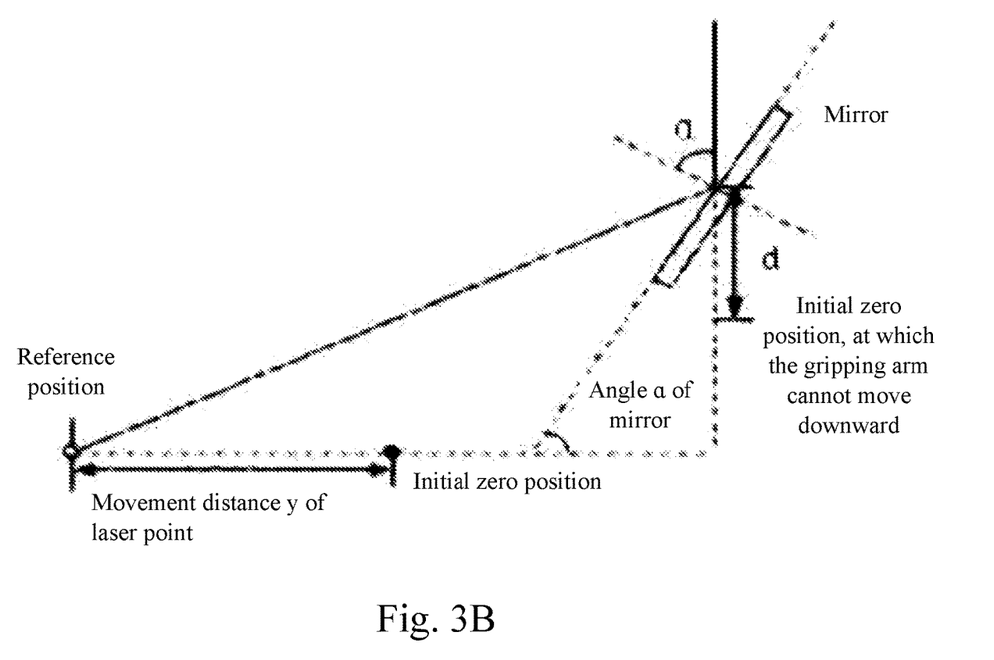
FIG. 3B is a schematic diagram of the geometric relationship of an automatic laser range calibration kit according to an exemplary embodiment of the present invention.

FIG. 3B is a schematic diagram of the geometric relationship of an automatic laser range calibration kit according to an exemplary embodiment of the present invention. The geometric relationship illustrates how a control computer calculates a reference position. As shown in FIG. 3B, the reference position may be determined by (1) an initial zero position, (2) distance in the z direction (d), and (3) the angle of a mirror ($\alpha$).

The initial zero position may refer to the position of a spot on a test plane when the distance between a test device and a DUT is at a minimum, that is, a gripping arm cannot move further downward, or a test plane cannot move further upward. In some embodiments, the initial zero position may be obtained by gradually moving the gripping arm down until the lower end of the test device is in slight contact with the DUT. At this time, the position of the spot may be recorded as the initial zero position.

The distance d in the z direction is a target distance between the test device and the DUT. For example, if a test requires a distance of 5 mm between the test device and the DUT, the distance in the z direction may be set as 5 mm.

The angle $\alpha$ of the mirror is the angle of the mirror relative to the test plane. Such angle may be adjusted to different values, such as 30°, 45° or 60°. Once the angle of the mirror is adjusted, the angle value should be updated to the control computer.

The moving distance (y) of the spot relative to the initial zero position may be calculated on the basis of the distance d in the z direction and the angle $\alpha$ of the mirror. In other words, when the distance between the test device and the DUT is d, the spot moves for distance y to leave the initial zero position and reach a new position. The new position of the spot is the reference position thereof. The moving distance y may be calculated by the following formula:

$$y = \frac{d}{\tan(2\alpha - 90°)}$$

During the test, when the spot overlaps the reference position, the distance between the test device and the DUT is calibrated to a target value (d).

In another embodiment, in order to calibrate the distance between the DUT and the test device by means of the automatic laser distance calibration kit, the distance is gradually reduced to zero in the first step. In other words, the surface of the test device and the surface of the DUT are in slight contact with each other. At this point, the distance between the DUT and the test set is calibrated to zero, that is the test system is calibrated. The automatic laser distance calibration kit is turned on, the laser pointer emits a laser beam that is reflected by the mirror and forms a spot at position O on the test plane, and such position O may be considered as the initial zero position of the spot. Any change in the position of the spot is measured from the position O.

In a second step, the test device and the DUT are moved away from each other by lifting the gripping arm up (or lowering the test plane or both).

In a third step, the target distance between the DUT and the test device may be set as, for example h=2 cm. Alternatively, the target distance may be preset by the user. Since the test system has been calibrated, in order to reach the position of h=2 cm, the distance between the DUT and the test device from zero positions thereof changes to $\Delta h$=2 cm. As described above, $\Delta h \propto \Delta d$, that is, the change in the position of the spot may be calculated. For example, if the mirror is fixed at an angle of 22.5°, $\Delta h$: $\Delta d$=1:1. Therefore, when $\Delta h$=2, $\Delta d$=2. In other words, in this case, when the distance between the DUT and the test device is 2 cm, the spot moves 2 cm from the position O. The reference position of the spot may then be set as position R, wherein the distance between position O and position R is 2 cm.

In a fourth step, the distance between the DUT and the test device is gradually reduced by lowering the gripping arm toward the test plane (or moving the test plane toward the gripping arm, or both). Alternatively, the distance may be gradually increased depending on the initial position of the DUT and the test device. Therefore, the position of the spot gradually approaches the reference position (position R), and the distance between the DUT and the test device gradually approaches the target distance. The position of the spot is monitored by the camera and reported to the control computer.

In a fifth step, when the spot reaches the reference position, that is, the spot completely overlaps the position R, the changing the position of the gripping arm (or test plane) is stopped.

The above process may be controlled by a control computer. The control computer may receive position information of the spot from the camera, and compare such position with the reference position by means of an image processing technique. When the position of the spot is different from the reference position, the control computer may automatically change the distance between the TX and RX coils by changing the position of the gripping arm (and/or test plane). When the position of the spot is the same as the reference position, the control computer may automatically stop changing the distance between the TX and RX coils and set the distance as a predetermined value, thereby completing the calibration of the distance. In addition, the control computer may adjust the movement speed of the gripping arm (or test plane). For example, when the distance between the TX and RX coils is different from a target distance, the control computer may quickly move the gripping arm, and move the gripping arm slowly as the distance approaches the target distance. The control computer may comprise a non-transitory computer readable medium that stores program codes for controlling a calibration process, and measuring and analyzing the positions of the TX and RX coils.

Figure 4A:
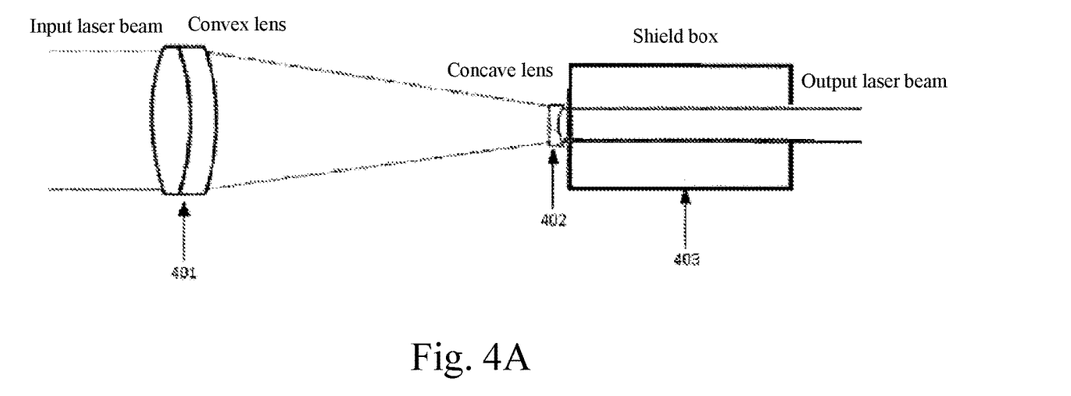
FIG. 4A is a schematic diagram showing the structure of a ray spatial filter.

In some embodiments, in order to improve the accuracy of the calibration, a small spot is required, and a light spatial filter is designed in the laser pointer to eliminate the haze of a laser beam. FIG. 4A is a schematic diagram showing the structure of a light spatial filter 400 according to an exemplary embodiment of the present invention.

The light spatial filter 400 may comprise a convex lens 401, a concave lens 402 and a shield box 403. The convex lens 401 is configured to converge an input laser beam into dots on the other side thereof. The concave lens 402 may diverge light. With a pair of convex and concave lenses, output laser beam will be more focused than the input laser beam. The shield box 403 is configured to block unwanted output laser beam from scattering. The beam output by the shield box 403 is a narrow laser beam with no unwanted scattering.

Figure 4B:
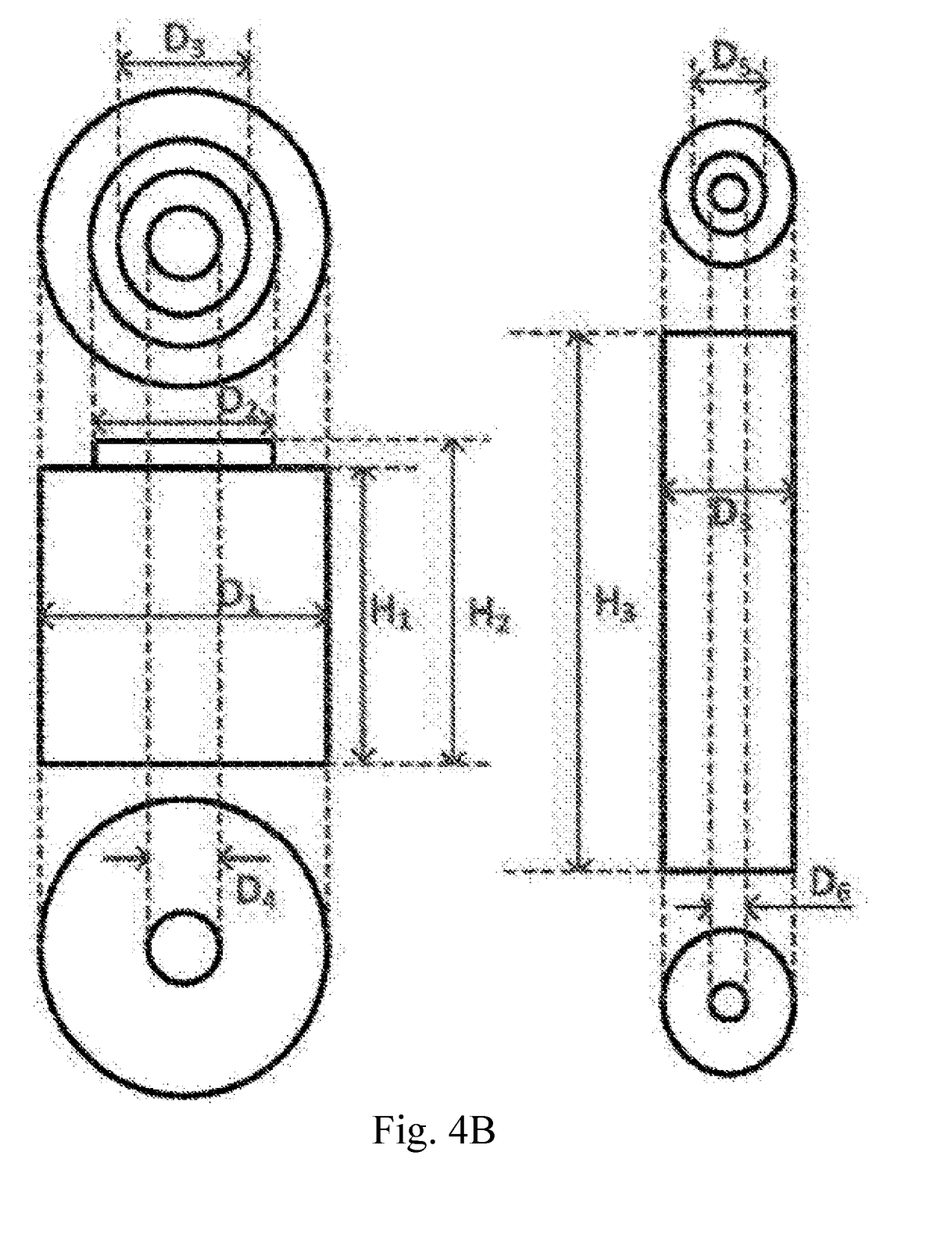
FIG. 4B is a schematic diagram showing the dimension of an exemplary component of a ray spatial filter according to an exemplary embodiment of the present invention.

The distance between the convex lens 401 and the concave lens 402 may be adjusted by two cylindrical components, namely component 1 and component 2. Lenses may be assembled at the ends of these components. The dimensions of the two exemplary components are labeled in FIG. 4B and are listed in Table 1. The distance between the convex lens and the concave lens may be adjusted between H3 (55.4 mm) and H3+H1 (83.4 mm).

TABLE 1

Dimensions of component 1 and component 2

| Marks | $H_1$ | $H_2$ | $H_3$ | $D_1$ | $D_2$ | $D_3$ | $D_4$ | $D_5$ | $D_6$ |
|---|---|---|---|---|---|---|---|---|---|
| Length (mm) | 28 | 30 | 55.4 | 22.2 | 16.42 | 11.66 | 6.14 | 5.92 | 4.29 |

It should be noted that one or more of the functions described above may be implemented by software or firmware that is stored in a memory and executed by a processor or is stored in a program memory and executed by a processor. The software or firmware may also be stored and/or transmitted in any non-transitory computer readable medium for use by or in connection with an instruction execution system, apparatus or device, such as a computer-based system and a processor-containing system, or other systems that may acquire instructions from an instruction execution system, apparatus or device and execute such instructions. Within the context of the present disclosure, a "computer-readable medium" may be any medium that contains or stores a program for use by or in connection with an instruction execution system, apparatus or device. The computer readable medium may comprise, but is not limited to, an electronic, magnetic, optical, electromagnetic, infrared, or semiconductor system, apparatus or device, a portable computer disk (magnetic), a random access memory (RAM) (magnetic), a read only memory (ROM) (magnetic), an erasable programmable read only memory (EPROM) (magnetic), a portable optical disc such as a CD, CD-R, CD-RW, DVD, DVD-R or DVD-RW or flash memory, such as compact flash cards, secure digital cards, USB storage devices and memory sticks. The scope of the present invention is not limited to the specific preferred embodiments described herein, as these embodiments are intended to illustrate several aspects of the present invention. In fact, various modifications of the present invention in addition to those shown and described herein will become apparent to those skilled in the art. Thus, such modifications are intended to fall within the scope of the following appended claims.

The invention claimed is:

1. A wireless charging test system for testing a wireless charging system, comprising:
    a gripping arm, configured to control a test device;
    a test plane, configured to control a device under test (DUT); and
    an automatic laser calibration kit, configured to calibrate a distance between the test device and the DUT,
    wherein the DUT is a charging pad containing one or more power transmitter (TX) coils and the test device is an electronic device having one or more power receiver (RX) coils, and
    wherein the calibration kit comprises:
    a laser pointer, configured to emit a laser beam;
    a mirror, positioned on the gripping arm and configured to reflect the laser beam to form a light spot on the test plane; and
    a camera, configured to monitor a position of the light spot.

2. The test system according to claim 1, wherein the mirror is placed at an angle relative to the test plane, so that a change in the position of the light spot is proportional to a change in the distance between the DUT and the test device.

3. The test system according to claim 1, wherein when the position of the light spot overlaps with a reference position, the distance between the DUT and the test device is set as a known value, both the reference position and the known value being preset by a user.

4. The test system according to claim 1, further comprising a control computer configured to receive the position of the light spot and control the distance between the DUT and the test device by moving the gripping arm relative to the test plane.

5. The test system according to claim 1, further comprising a light spatial filter, wherein the light spatial filter comprises a convex lens, a concave lens, and a shield box.

6. A method for calibrating a distance between a test device of a wireless charging system and a DUT by using an automatic laser calibration kit mounted on a wireless charging test system, wherein the test system comprises a test plane for controlling the DUT, a gripping arm for controlling the test device, and a laser pointer mounted on the gripping arm and configured to form a light spot on the test plane; and the method comprises:

placing the DUT on the plane;

affixing the test device the gripping arm;

setting a reference position on the test plane;

emitting a laser beam from the laser pointer;

deflecting the laser beam using a mirror positioned on the gripping arm to project a light spot on the test plane;

monitoring the position of the light spot using a camera; and moving the gripping arm relative to the test plane until the light spot overlaps with the reference position on the test plane.

7. The method according to claim 6, wherein the DUT is a TX coil and the test device is an RX coil.

\* \* \* \* \*